United States Patent
Færevaag

(10) Patent No.: US 8,633,743 B2
(45) Date of Patent: Jan. 21, 2014

(54) LOW POWER BROWN OUT DETECTOR

(75) Inventor: Erik Fossum Færevaag, Bergen (NO)

(73) Assignee: Silicon Laboratories Norway AS, Oslo (NO)

( * ) Notice: Subject to any disclaimer, the term of this patent is extended or adjusted under 35 U.S.C. 154(b) by 0 days.

(21) Appl. No.: 13/501,524

(22) PCT Filed: Oct. 14, 2010

(86) PCT No.: PCT/IB2010/002838
§ 371 (c)(1),
(2), (4) Date: Apr. 12, 2012

(87) PCT Pub. No.: WO2011/045677
PCT Pub. Date: Apr. 21, 2011

(65) Prior Publication Data
US 2012/0187985 A1     Jul. 26, 2012

Related U.S. Application Data

(60) Provisional application No. 61/251,975, filed on Oct. 15, 2009.

(51) Int. Cl.
*H03L 7/00* (2006.01)
(52) U.S. Cl.
USPC .......................... 327/143; 327/142; 327/198
(58) Field of Classification Search
USPC ......................................... 327/142, 143, 198
See application file for complete search history.

(56) References Cited

U.S. PATENT DOCUMENTS

| | | | |
|---|---|---|---|
| 7,589,568 B2* | 9/2009 | Steedman et al. | 327/77 |
| 2002/0140402 A1 | 10/2002 | Sudo | |
| 2007/0132486 A1 | 6/2007 | O'Keefe | |
| 2008/0018368 A1 | 1/2008 | Wadhwa et al. | |

OTHER PUBLICATIONS

International Search Report for related international application No. PCT/IB2010/002838, report dated Apr. 13, 2011.

* cited by examiner

*Primary Examiner* — John Poos
(74) *Attorney, Agent, or Firm* — Miller, Matthias & Hull LLP

(57) ABSTRACT

A brown out detector (BOD), configured to provide a BOD reset in the event of a brown out event, is provided. The BOD includes means for tracking a reference voltage that is updated through duty cycling schemes so as to reduce power consumption, as well as means for detecting a falling flank of a supply voltage so as to optimize response times. More specifically, the BOD includes at least one track module, at least one sample module, at least one detector module and at least one comparator. The comparator is configured to compare a duty cycled tracked reference voltage with a duty cycled sampled reference voltage and to output a BOD reset if the tracked reference voltage is less than the sampled reference voltage. The comparator is further capable of exhibiting improved response times when a boost current is received. The boost current is provided by the detector module when the supply voltage falls beyond a predetermined threshold.

23 Claims, 5 Drawing Sheets

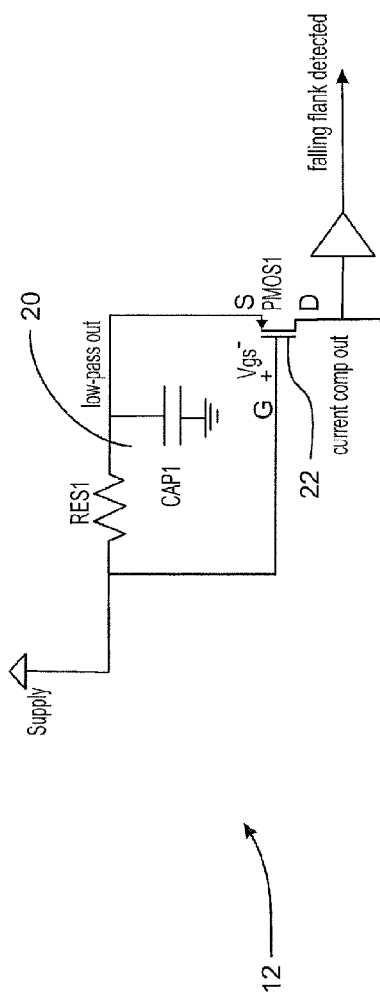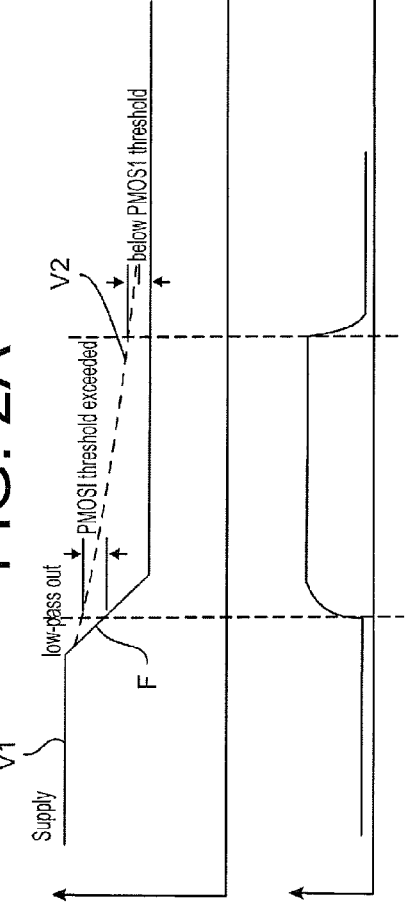

LOW POWER BROWN OUT DETECTOR

CROSS-REFERENCE TO RELATED APPLICATION

This application is a 35 USC §371 US National Stage patent application of International Patent Application No. PCT/IB2010/002838 filed on Oct. 14, 2010, and claims priority to U.S. Provisional Application Ser. No. 61/251,975, filed on Oct. 15, 2009.

BACKGROUND

1. Technical Field

The present disclosure relates to brown out detection techniques, and more particularly, to devices and method for detecting brown out events with optimized response times, minimized power consumption and uncompromised reliability and accuracy.

2. Description of the Related Art

Brown out events are well known in the art of electronics and pertain to conditions in which the voltage supplied to a particular electronic device or system falls below the minimum operating voltage allowable for the given device or system. During a brown out event, when the supply voltage falls below the minimum operating voltage allowable for the particular device, an associated processor, microprocessor, controller, microcontroller, or the like, may become corrupt and lose functionality. Accordingly, it is ideal to quickly detect such events, reset the associated processor and to resume operations when normal operating conditions and supply voltages are revived.

Currently existing electronic devices and systems employ brown out detectors (BODs), and the like, which do such things. For instance, in an effort to prevent data corruption or any other negative effects possibly caused by brown outs, a typical BOD may output a signal, or the like, to reset the associated processor of the device in response to a detected low supply voltage or brown out event. A typical BOD may further be able to detect when the supply voltage returns to acceptable levels so as to re-enable normal operations when appropriate, for example, by way of a power on reset (POR), or the like. Triggering such a reset enables the processor and the device to resume operations from a known or default state of the processor as soon as the supply voltage returns within acceptable operating conditions. Although currently existing devices may provide accurate detection of brown out events as well as reliable safeguards for electrical systems, there is still significant room for improvement.

While all typical electronics are susceptible to brown out events, brown out events are more prevalent in portable devices, which generally have less secure connections between the device and a power supply, such as a battery, or the like, powering the device. As such, BODs are considered more of a necessity in portable devices than in stationary devices. However, when used with portable devices, BODs may considerably shorten the life of an associated battery. This is because BODs typically require a constant source of steady state current in order to function properly, which in turn, consumes a considerable amount of power.

Accordingly, there is a need for providing more energy efficient devices which consume considerably less power, and in terms of portable devices, allow longer battery runtimes. Moreover, there is a need for improved techniques for detecting brown out events which provide uncompromised reliability and accuracy with significantly reduced power consumption. Specifically, there is a need for eliminating the continuous draw of current as found in typical BODs and to improve upon BOD response times without adversely affecting performance.

SUMMARY OF THE DISCLOSURE

In satisfaction of the aforenoted needs, an apparatus and a method for optimizing brown out detection response times using minimal power are disclosed.

A brown out detector (BOD) with falling flank detection for minimized power consumption and optimized response times is disclosed. The BOD includes at least one track module, at least one sample module and at least one comparator. The track module is configured to receive a supply voltage and output a tracked reference voltage. The sample module is configured to receive a reference voltage and output a sampled reference voltage based on the reference voltage. Additionally, the comparator is configured to compare the tracked reference voltage with the sampled reference voltage and to output a BOD reset if the tracked reference voltage is less than the sampled reference voltage.

In a refinement, the BOD further includes a detector module configured to monitor the supply voltage and output a boost current when the supply voltage falls beyond a predetermined threshold.

In a related refinement, the comparator includes a topology configured to have improved response times when the boost current is received.

In another refinement, the track module includes a sample and track circuit.

In another refinement, the track module includes a capacitive voltage divider so as to enable the detector to monitor the supply voltage during non-sampled periods.

In another refinement, the track module receives a proportion of the supply voltage.

In another refinement, the sampled reference voltage is duty cycled.

In another refinement, the sample module includes a sample and hold circuit.

In another refinement, the detector module is configured to detect a falling flank of the supply voltage.

In yet another refinement, the comparator is biased in nanoampere ranges of current.

A method for detecting brown out events with optimized response times and minimized power consumption is disclosed. The method includes the steps of providing a supply voltage and a reference voltage, monitoring the supply voltage for decreases in voltage exceeding a predetermined threshold, comparing the supply voltage with the reference voltage, and outputting a BOD reset when the supply voltage is less than the reference voltage.

In a refinement, the method further includes a step of supplying a boost current in response to decreases in the supply voltage exceeding a predetermined threshold and/or fall ratio dV/dt to optimize response times.

In another refinement, the supply voltage is tracked to provide a tracked reference voltage to be compared with the reference voltage.

In another refinement, the reference voltage is sampled to provide a sampled reference voltage to be compared with the supply voltage.

In another refinement, the supply voltage is tracked to provide a tracked reference voltage, and the reference voltage is sampled to provide a sampled reference voltage, and wherein the tracked reference voltage is compared to the sampled reference voltage.

In another refinement, the tracked reference voltage is provided by a sample and track circuit.

In another refinement, the step of monitoring the supply voltage occurs during non-sampled periods.

In another refinement, the tracked reference voltage corresponds to a proportion of the supply voltage.

In another refinement, the sampled reference voltage is duty cycled.

In another refinement, the sampled reference voltage is provided by a sample and hold circuit.

In another refinement, the step of monitoring the supply voltage monitors for a falling flank of the supply voltage.

In yet another refinement, the step of comparing is performed using a comparator biased in nano-ampere ranges of current.

Other advantages and features will be apparent from the following detailed description when read in conjunction with the attached drawings.

BRIEF DESCRIPTION OF THE DRAWINGS

The disclosed brown out detection (BOD) apparatus and method are described more or less diagrammatically in the accompanying drawings wherein:

FIG. 2A is a schematic of an exemplary detector module of a BOD;

FIG. 2B is a graphical illustration of exemplary operations of the detector module of FIG. 2A;

It should be understood that the drawings are not necessarily to scale and that the embodiments are sometimes illustrated by graphic symbols, phantom lines, diagrammatic representations and fragmentary views. In certain instances, details which are not necessary for an understanding of this disclosure or which render other details difficult to perceive may have been omitted. It should be understood, of course, that this disclosure is not limited to the particular embodiments and methods illustrated herein.

DETAILED DESCRIPTION OF THE DISCLOSURE

Figure 1:
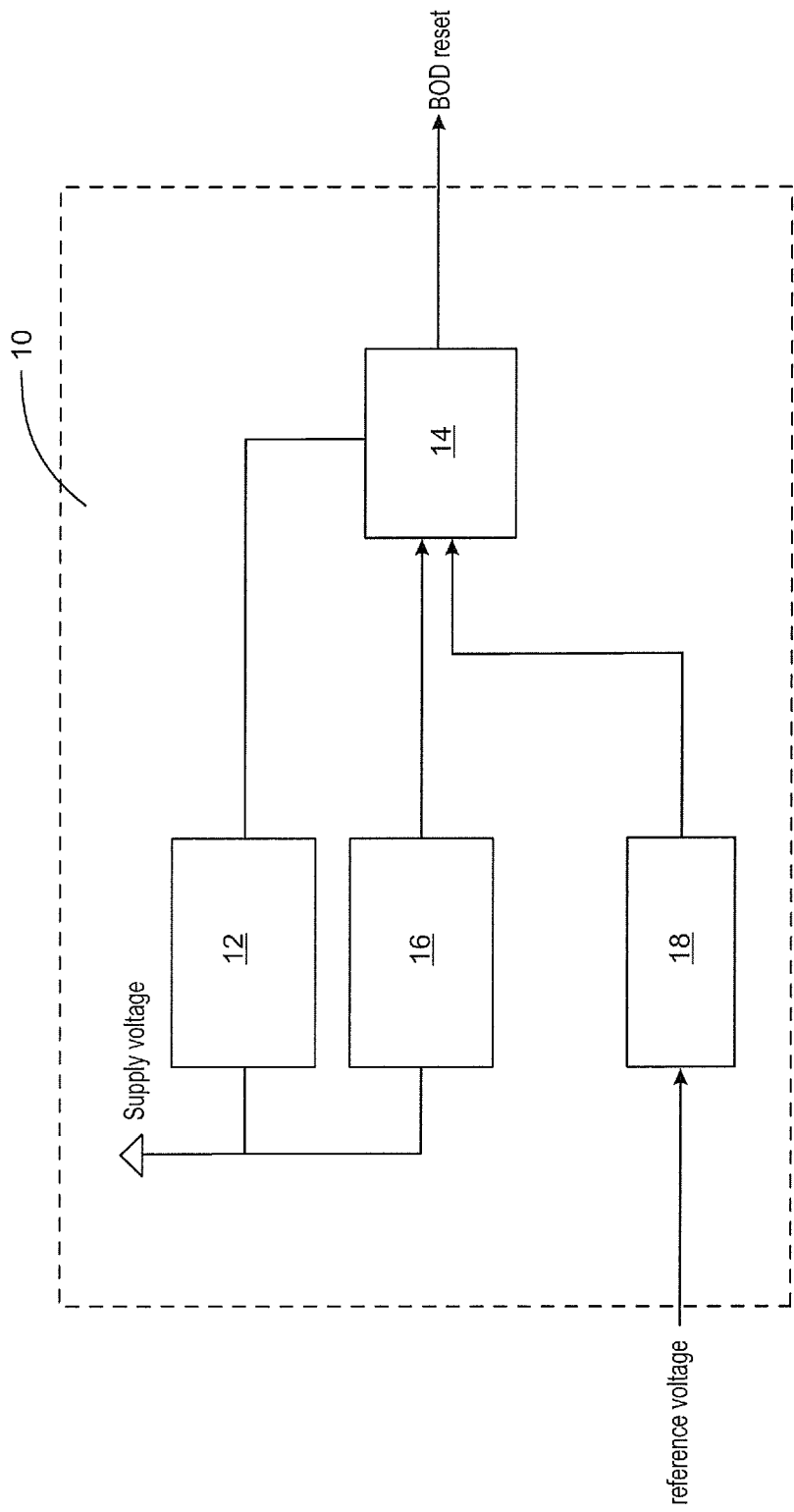
FIG. 1 is a schematic of an exemplary BOD device that is constructed in accordance with this disclosure.

FIG. 1 illustrates an exemplary low power brown out detector (BOD) 10 constructed in accordance with the teachings of the disclosure. The BOD 10 may be configured to detect low supply voltage, or brown out events, and respond accordingly. More specifically, the BOD 10 may be configured to periodically sample, or sample and track, the voltage supplied to an electrical device associated with the BOD 10 and detect when the supply voltage falls below a predefined threshold, or a minimum operating voltage required for proper functionality of the electrical device. When such a brown out event is detected, the BOD 10 may be configured to output a BOD reset, for instance, in the form of a flag, trigger, signal, or the like, to the associated processor, microprocessor, controller, microcontroller, or the like. Such a BOD reset may serve to reset or set the associated processor to a known state, such that normal operation may be resumed in the known state when the brown out event ceases and the supply voltage returns to acceptable conditions.

As shown in the exemplary embodiment of FIG. 1, the BOD 10 may include a detector module 12 and a comparator 14, a track module 16 and a sample module 18. Specifically, the detector module 12 may be configured to receive a supply voltage, and further, optionally configured to detect a decrease in the supply voltage. Moreover, the detector module 12 may be configured to detect a falling flank of the supply voltage, and further, determine if the falling flank exceeds a predefined limit or threshold. The comparator 14 may be configured to receive the supply voltage as well as a reference voltage, and further, to output a BOD reset depending on the relative values of the supply and reference voltages. The track module 16 may be configured to at least partially receive the supply voltage and output a tracked reference voltage. The tracked reference voltage provided by the track module 16 may be a sampled and/or tracked reference voltage, which further, may correspond to a proportion or a ratio of the supply voltage. The sample module 18 may be configured to receive the reference voltage and output a sampled reference voltage. The sampled reference voltage may be a duty cycled reference voltage so as to significantly reduce the power consumed by the BOD 10.

If the supply voltage falls beyond the predefined threshold, or if a falling flank of the supply voltage exceeds a predetermined threshold, the detector module 12 may be configured to generate or output a boost current, or the like. The comparator 14 may be configured to compare the tracked reference voltage provided by the track module 16 with the sampled reference voltage provided by the sample module 18, and output the BOD reset when the tracked reference voltage falls below the sampled reference voltage. The BOD reset may be provided to a processor, microprocessor, controller, microcontroller, or the like, and configured to reset the associated processor or controller to a known or default state. The comparator 14 may further be configured to receive the boost current provided by the detector module 12, and if available, the boost current may be used to significantly improve the response time of the comparator 14. Moreover, once supplied with a boost current and when necessary, the comparator 14 may be able to output a BOD reset in substantially less time than otherwise.

Turning to FIG. 2A, an exemplary detector module 12 as applied to, for example, the BOD 10 of FIG. 1 is provided. As in the particular embodiment shown, the detector module 12 may be configured to monitor a supply voltage for, and detect, falling flanks of a supply voltage without relying on a steady state mode. Particularly, the detector module 12 may include a low pass filter 20 having an input configured to at least partially receive the supply voltage to be monitored, and further, having an output. The output of the low pass filter 20 may be coupled across the gate G and source S of a p-type metal-oxide semiconductor (PMOS) transistor 22, or the like. More specifically, the PMOS transistor 22 may be configured so as to be enabled by a difference in voltage across the output of the low pass filter 20 caused by falling flanks on the supply voltage.

For instance, during a falling flank, and while the voltage at the supply has dropped abruptly, the voltage at the output of the low pass filter may remain high. If greater than a threshold of the particular PMOS transistor 22, the filtered voltage output by the low pass filter 20 may enable the PMOS transistor 22 to turn on. When enabled, the PMOS transistor 22 may provide a pull-up circuit between its drain D and the supply voltage to provide boost enable signal. As graphically illustrated in FIG. 2B, when a falling flank F is detected in the supply voltage V1, the corresponding voltage V2 output by the low pass filter 20 may remain high, and be great enough in magnitude to enable the PMOS transistor 22. When the PMOS transistor 22 is enabled, a boost current may be provided. When the difference in voltage V2 across the output of the low pass filter 20 is not large enough to enable the PMOS transistor 22, the boost current may be disabled.

Figure 3:
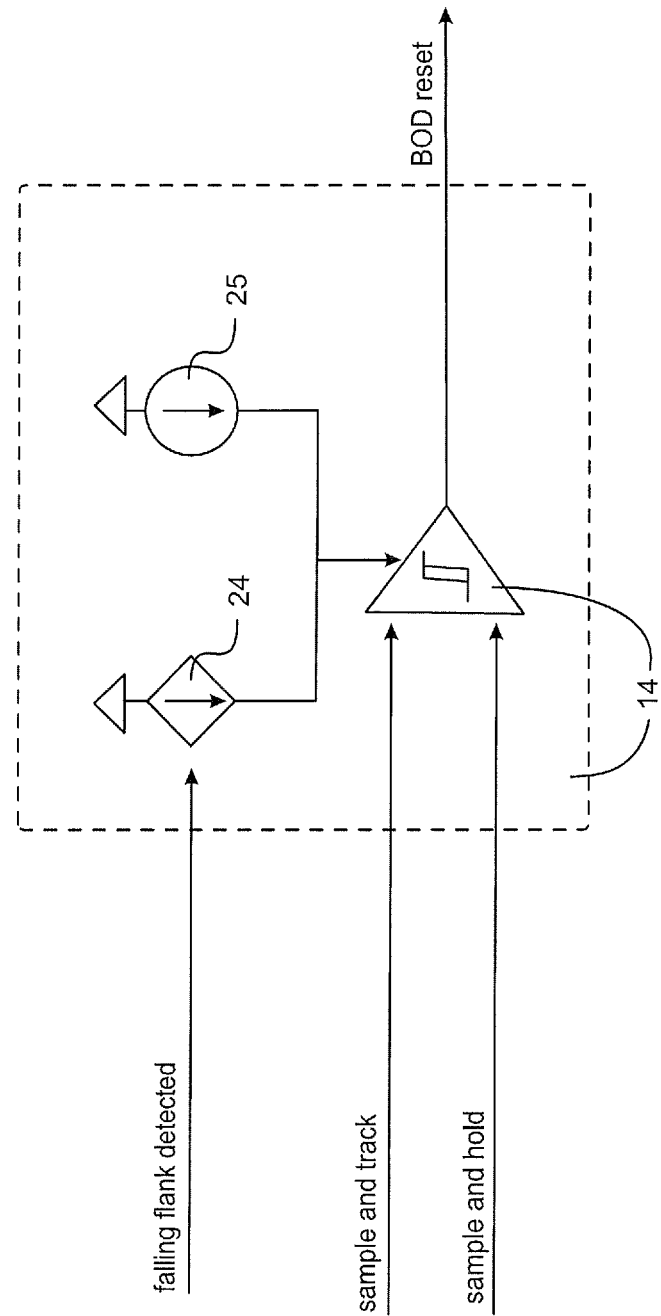
FIG. 3 is a schematic of an exemplary comparator of a BOD.

Referring now to FIG. 3, an exemplary comparator 14, as applied to the BOD 10 and detector module 12 of FIG. 1, is provided. The comparator 14 may essentially be configured to output a BOD reset when the supply voltage drops below a reference voltage, or a minimum acceptable operating voltage. Furthermore, the response time of the comparator 14, or the time required by the comparator 14 to output a BOD reset in response to a detected brown out event, may be dependent on the current drawn by the comparator 14. As such, the response time of the comparator 14 may be slower during brown out events when the current provided to the comparator 14 is low. In order to compensate for the lowered current and thus slower response times, the boost current provided by the detector module 12, for instance, may be supplied to the comparator 14 during such times. In particular, the comparator 14 may employ current sources, such as the current controlled current source 24 of FIG. 3, which may drive current according to the amount of the boost current received from the detector module 12. Accordingly, supplying the comparator 14 with such a boost current may significantly improve response times of the comparator 14. Furthermore, as fast responses may be required only when falling flanks are detected in the supply voltage, current consumption may be further minimized by limiting such a boost current to only those times when a brown out event occurs.

Figure 4A:
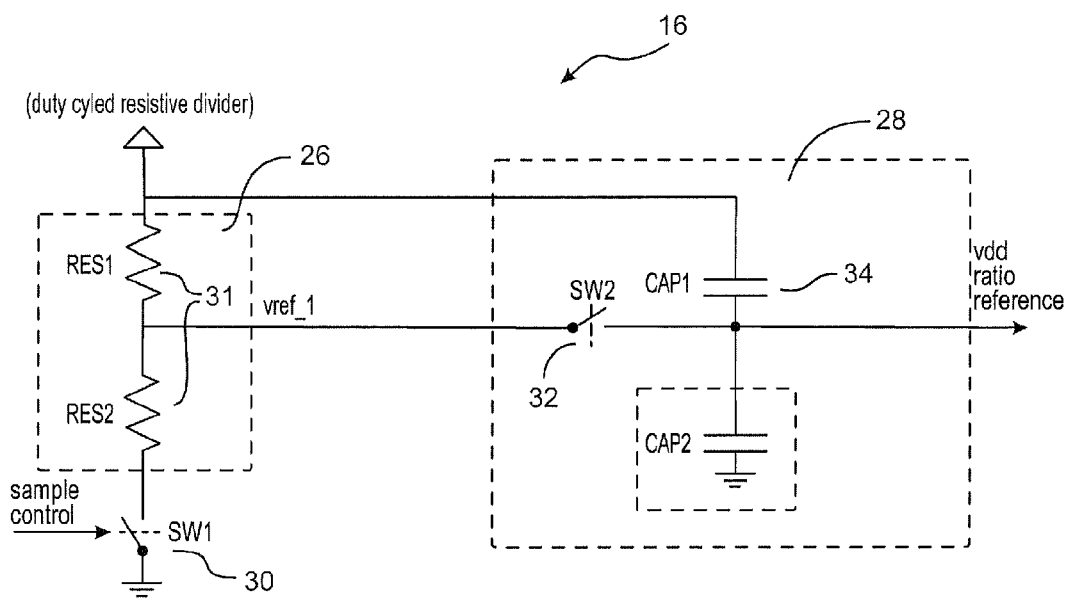
FIG. 4A is a schematic of an exemplary track module of a BOD.
Figure 4B:
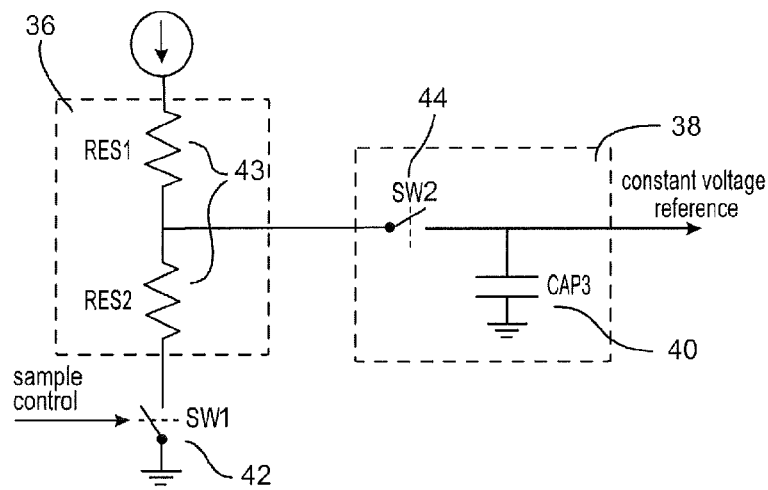
FIG. 4B is a schematic of an exemplary sample module of a BOD.

In order to further minimize the power consumed by the BOD 10 and to eliminate the need for steady state current, the BOD 10 may include a track module 16 and a sample module 18, as shown in FIGS. 4A and 4B, respectively. More specifically, the track module 16 may essentially include a resistive divider 26 and a track element 28. The resistive divider 26 may be configured so as to be selectively coupled to a supply voltage and enabled by a first switch 30. During a duty phase, the resistive divider 26 may be enabled by closing the first switch 30 and completing the circuit, for instance, to ground, or the like. The desired reference voltage, or ratio of the reference voltage, may be tapped between one or more resistors 31 by a second switch 32 and tracked by the track element 28. More specifically, the reference voltage or voltage ratio at the track element 28 may be updated by closing the second switch 32. Once updated, the second switch 32 may be opened while one or more storage devices, such as the first capacitor 34 and/or an optional second capacitor 35, within the track element 28 may serve to follow or track the referenced supply voltage. Once the duty phase is complete, the first switch 30 may be opened to save power while the storage devices 34 may continue to track and supply a reference voltage or ratio thereof. The sample module 18 may similarly include a resistive divider 36 that is selectively coupled to a constant voltage reference and a hold element 38 having one or more storage devices 40. During the duty phase, a first switch 42 may be closed to provide a current through the resistive divider 36 and to form a voltage across one or more resistors 43. The second switch 44 may be closed to update the hold element 38 with the voltage that is tapped between the resistors 43, and store a charge in the storage device 40. Once the update is complete, the switches 42, 44 may be opened so as to minimize power consumption.

Figure 5:
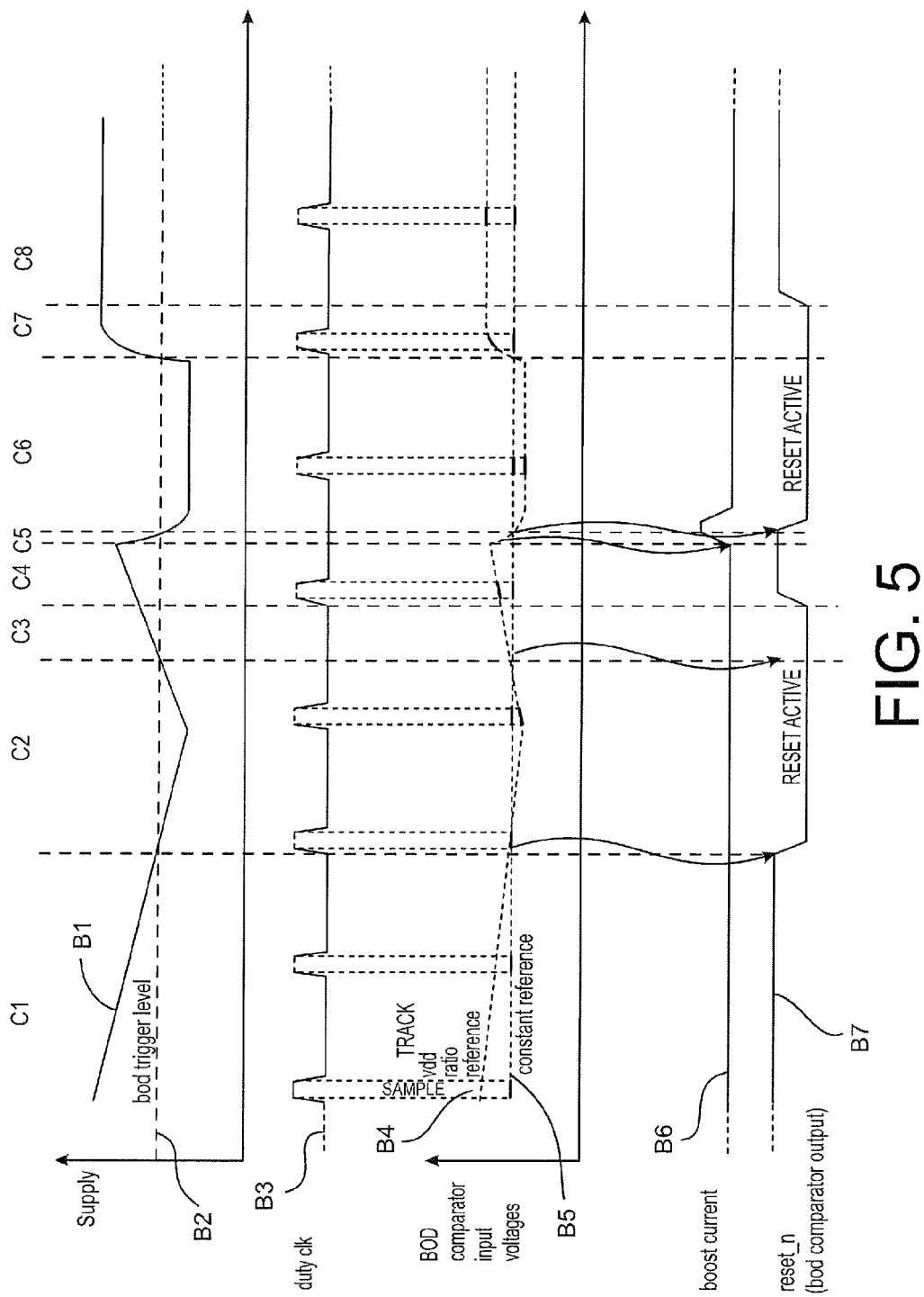
FIG. 5 is a timing diagram illustrating exemplary operations of a BOD.

Turning to FIG. 5, an exemplary timing diagram of the BOD 10 of FIG. 1 is provided. As shown, the supply voltage B1 provided to a particular device may be inconsistent and fluctuating to levels above or beyond ideal and nominal operating voltage levels, as indicated by the BOD trigger level at B2. The track module 16 of FIG. 1 may be used to track the supply voltage B1, or a ratio thereof, according to a duty cycle B3, and further, output a tracked referenced voltage B4 as shown. Similarly, the sample module 18 of FIG. 1 may be used to sample and hold a constant reference voltage and output the sampled reference voltage B5 shown. Each of the tracked and sampled reference voltages B4, B5 may be provided to an input of, for instance, the comparator 14 of FIG. 1. When the tracked reference voltage B4 falls below the sampled reference voltage B5, as demonstrated in sector C2 of FIG. 5, the comparator 14 may activate a reset of an associated processor or controller, as indicated by the corresponding logical LOW of the BOD reset B7. As no sudden decrease in the supply voltage, or a falling flank, is detected by a detector module 12 in sector C2, the corresponding boost current B6 may be null. However, when the supply voltage B1, and thus, the tracked reference voltage B4 fall at a significantly fast rate, as demonstrated in sector C5, a falling flank may be detected by the detector module 12 of FIG. 1, and a boost current B6 may be provided to the comparator 14 to enable a faster response. More specifically, the rise indicated at sector C5 may represent the boost current B6 that is generated by the detector module 12 and supplied to the comparator 14 of FIG. 1. As the response time of the comparator 14 may be dependent on the magnitude of the current received, the boost current B6 received at sector C5 may enable the comparator 14 to output a BOD reset B7 at a significantly faster rate than otherwise.

INDUSTRIAL APPLICABILITY

In satisfaction of the above-identified needs, an improved apparatus and method for detecting brown out events is disclosed that collectively incorporates and integrates various energy saving techniques and strategies to provide optimum performance at minimum power. Specifically, the disclosed devices and methods provide means for sampling reference voltages to minimize power consumption as well as means for detecting a falling flank of a supply voltage. The disclosed devices and methods further supply boost current to a nano-ampere biased comparator so as to significantly shorten response times and provide faster BOD resets to an associated processor or controller.

While only certain embodiments have been set forth, alternatives and modifications will be apparent from the above description to those skilled in the art. These and other alternatives are considered equivalents and within the spirit and scope of this disclosure and the appended claims.

What is claimed:

1. A brown out detector (BOD) for minimized power consumption and optimized response times, comprising:
   at least one track module configured to receive a supply voltage and output a tracked reference voltage;
   at least one sample module configured to receive a reference voltage and output a sampled reference voltage based on the reference voltage;
   at least one detector module configured to monitor the supply voltage; and
   at least one comparator configured to compare the tracked reference voltage with the sampled reference voltage and to output a BOD reset if the tracked reference voltage is less than the sampled reference voltage.

2. The BOD of claim 1, wherein the at least one detector module is configured to monitor the supply voltage and output a boost current when the supply voltage falls beyond a predetermined threshold.

3. The BOD of claim 2, wherein the comparator is configured to have improved response times when the boost current is received.

4. The BOD of claim 1, wherein the track module includes a sample and track circuit.

5. The BOD of claim 1, wherein the track module includes a capacitive voltage divider so as to enable the detector to monitor the supply voltage during non-sampled periods.

6. The BOD of claim 1, wherein the track module receives a proportion of the supply voltage.

7. The BOD of claim 1, wherein the tracked reference voltage is selectively tracked and duty cycled.

8. The BOD of claim 1, wherein the sampled reference voltage is duty cycled.

9. The BOD of claim 1, wherein the sample module includes a sample and hold circuit.

10. The BOD of claim 2, wherein the detector module is configured to detect a falling flank of the supply voltage.

11. The BOD of claim 1, wherein the comparator is biased in nano-ampere ranges of current.

12. A method for detecting brown out events with optimized response times and minimized power consumption, comprising the steps of:
    providing a supply voltage and a reference voltage;
    monitoring the supply voltage for decreases in voltage exceeding a predetermined threshold;
    comparing the supply voltage with a sample of the reference voltage; and
    outputting a BOD reset when the supply voltage is less than the reference voltage.

13. The method of claim 12 further comprising a step of supplying a boost current in response to decreases in the supply voltage exceeding the predetermined threshold to optimize response times.

14. The method of claim 12, wherein the supply voltage is tracked to provide a tracked reference voltage to be compared with the reference voltage.

15. The method of claim 12, wherein the reference voltage is sampled to provide a sampled reference voltage to be compared with the supply voltage.

16. The method of claim 12, wherein the supply voltage is tracked to provide a tracked reference voltage, and the reference voltage is sampled to provide a sampled reference voltage, and wherein the tracked reference voltage is compared to the sampled reference voltage.

17. The method of claim 14, wherein the tracked reference voltage is provided by a sample and track circuit.

18. The method of claim 12, wherein the step of monitoring the supply voltage occurs during non-sampled periods.

19. The method of claim 14, wherein the tracked reference voltage corresponds to a proportion of the supply voltage.

20. The method of claim 14, wherein the tracked reference voltage selectively tracked and duty cycled.

21. The method of claim 15, wherein the sampled reference voltage is duty cycled.

22. The method of claim 15, wherein the sampled reference voltage is provided by a sample and hold circuit.

23. The method of claim 12, wherein the step of monitoring the supply voltage monitors for a falling flank of the supply voltage.

* * * * *